United States Patent [19]
Cantrell

[11] Patent Number: 5,642,264
[45] Date of Patent: Jun. 24, 1997

[54] APPARATUS FOR SUPPORTING CIRCUIT CARDS IN SLOT LOCATIONS

[75] Inventor: Gregory A. Cantrell, Mesquite, Tex.

[73] Assignee: E-Systems, Inc., Dallas, Tex.

[21] Appl. No.: 379,085

[22] Filed: Jan. 26, 1995

Related U.S. Application Data

[63] Continuation of Ser. No. 990,197, Dec. 11, 1992, abandoned, and a continuation-in-part of Ser. No. 678,102, Apr. 1, 1991, Pat. No. 5,172,306.

[51] Int. Cl.$^6$ .................... H05K 7/14; H01R 13/642
[52] U.S. Cl. .................. 361/802; 361/756; 361/796; 361/797; 361/801; 439/64; 439/377
[58] Field of Search .................. 211/41; 312/15, 312/320; 361/724, 726, 727, 732, 740, 741, 747, 756, 759, 796, 797, 801, 802; 439/61, 327, 328; 206/334

[56] References Cited

U.S. PATENT DOCUMENTS

| | | | |
|---|---|---|---|
| 3,733,523 | 5/1973 | Reynolds et al. | 361/796 |
| 3,878,438 | 4/1975 | Weisman | 361/802 |
| 4,235,490 | 11/1980 | Schwartz et al. | 312/15 |
| 4,277,120 | 7/1981 | Drake et al. | 312/320 |
| 4,328,897 | 5/1982 | Weiss | 361/802 |
| 4,462,499 | 7/1984 | Calabro | 211/41 |
| 4,498,123 | 2/1985 | Fuss et al. | 361/731 |
| 4,506,785 | 3/1985 | Seefeldt | 361/802 |
| 4,866,576 | 9/1989 | Umetsu et al. | 211/41 |
| 5,008,778 | 4/1991 | Peyerl | 361/756 |
| 5,172,306 | 12/1992 | Cantrell | 361/802 |

FOREIGN PATENT DOCUMENTS

| | | | |
|---|---|---|---|
| 0387388 | 9/1990 | European Pat. Off. . | |
| 0507230 | 10/1992 | European Pat. Off. | 361/802 |
| 2133266 | 1/1973 | Germany . | |
| 2750871 | 7/1978 | Germany . | |
| 137781 | 9/1979 | Germany . | |
| 0137781 | 9/1979 | Germany | 361/801 |
| 2932883 | 3/1980 | Germany . | |
| 3004271 | 8/1981 | Germany . | |
| 1-77997 | 3/1989 | Japan | 361/802 |
| 5-95194 | 4/1993 | Japan | 361/796 |

OTHER PUBLICATIONS

IBM Disclosure Bulletin "Card On Board Support System" vol. 30 No. 12 May 1988.

*Primary Examiner*—Donald A. Sparks
*Attorney, Agent, or Firm*—Harold E. Meier

[57] ABSTRACT

A chassis having a unique configuration is provided along with card guide assemblies having predefined configuration types for selective installation in the chassis. The guide assemblies, when installed within the chassis, enable circuit cards having varying standard dimensions to be mounted and secured within the chassis regardless of slot location. A first type of card guide assembly is mounted at the end of a plurality of slot locations a predetermined first standard distance apart to enable cards having a first length and one of a number of depths to be installed. A second type card guide assembly is mounted between the opposed first card guide assemblies at any slot location a second predetermined standard distance from one of the first guide assemblies to form a slot partition and enable the installation of cards having a second length shorter than the first length and one of the number of depths.

7 Claims, 6 Drawing Sheets

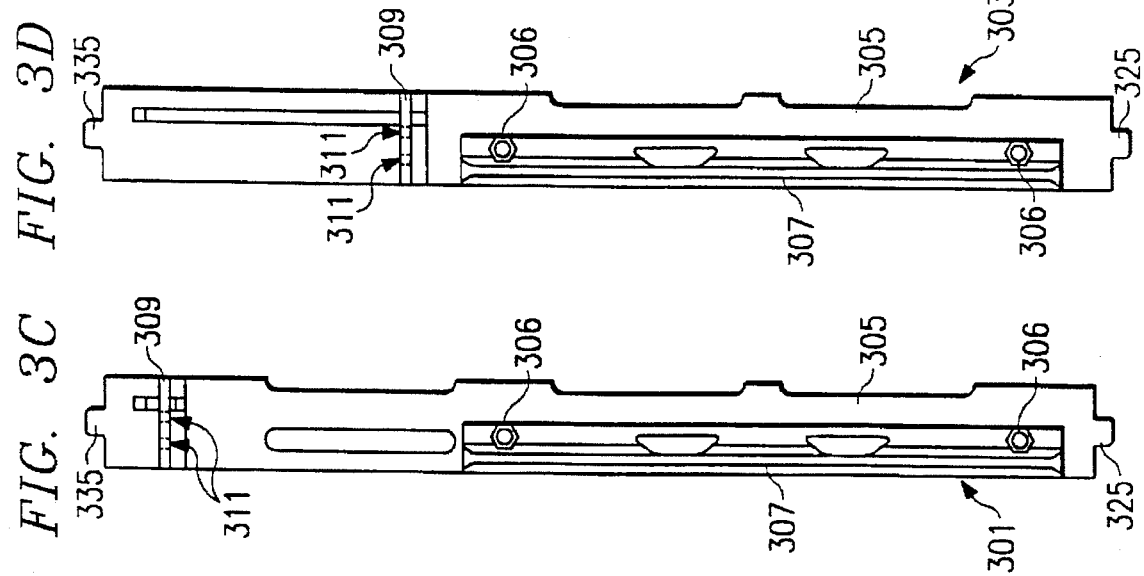
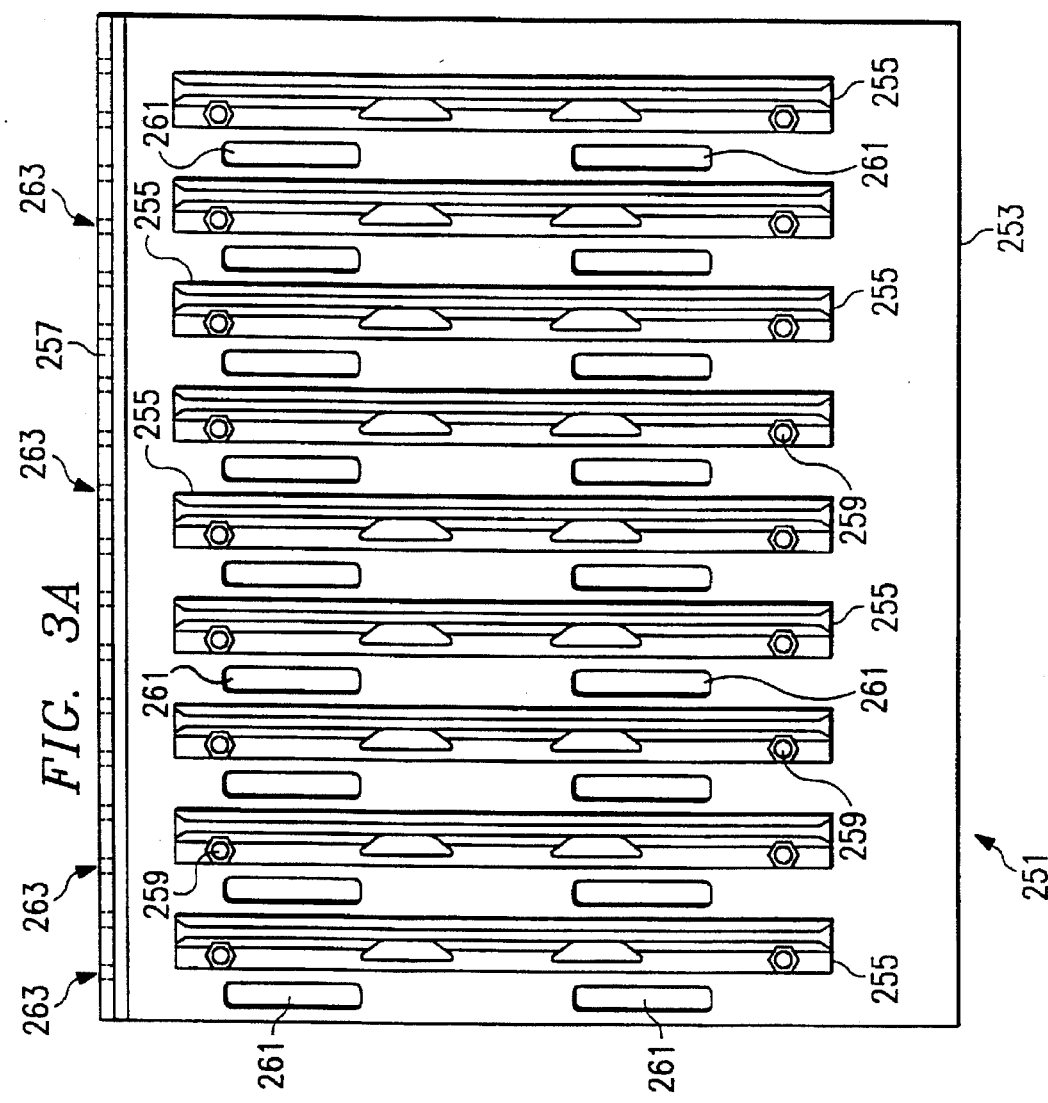

APPARATUS FOR SUPPORTING CIRCUIT CARDS IN SLOT LOCATIONS

CROSS-REFERENCE TO RELATED APPLICATIONS

This Application is a continuation of Ser. No. 07/990,197 filed Dec. 11, 1992 now abandoned and a continuation-in-part of U.S. Application for Patent Ser. No. 07/678,102 filed Apr. 1, 1991, now U.S. Pat. No. 5,172,306, issued Dec. 15, 1992.

TECHNICAL FIELD

This invention relates to the mounting of circuit cards within an enclosure or chassis, and in particular to a chassis and a plurality of card guide assemblies mounted within the chassis that facilitate the installation and retention of circuit cards in a plurality of dimensions regardless of location.

BACKGROUND OF THE INVENTION

ANSI/IEEE standards regulate the accepted dimensions, for example, length by depth, of the electronic circuit cards utilized in conjunction with standard communications backplanes. Circuit cards are generally provided in certain lengths that are often directly related to the number of backplane connectors attached to a bottom edge of the card. For example, a circuit card of length 3U typically has one backplane connector mounted on its bottom edge. Cards of lengths 6U and 9U also have at least one backplane connector and often have two and three backplane connectors, respectively, mounted on their bottom edges. These connectors mate with corresponding connectors mounted to the backplane and thus electrically connect the card to the backplane and enable communications therebetween. Other standard and non-standard card lengths are commercially available.

Circuit cards are also provided in a number of standard depths. Two of the most popular depths are 160 mm and 220 mm. Other card depths, both shorter and taller than the standard depths recited above, are commercially available.

A circuit card is typically installed within an enclosure or chassis by positioning the card between a pair of card guides mounted at the opposite ends of each slot location. Each card guide includes a guide slot that accepts and retains one of the side edges of the installed card. As the card is inserted down the guide slot, each connector on the bottom edge of the card is inserted into a mating connector on the backplane. Installation of the circuit card is completed by retaining the top edge of the card within the enclosure to prevent shifting of the card along the guide slot and disengagement of the card connectors mated to the backplane connectors.

The card enclosures or chassis of the prior art includes card guides that only accommodate one depth of circuit card per slot location. The prior art chassis is further designed with one or more fixed partitions to segregate areas for accommodating only one type or dimension of circuit card. For example, each individual area only accepts cards having a predetermined length by depth. The use of partitions in the prior art chassis fixes the number of slot locations available for accepting cards of each predetermined dimension. Thus, within the enclosure or chassis of the prior art, certain areas are inflexibly dedicated to receive a predetermined number of circuit cards having only one particular dimension.

The most significant disadvantage experienced with the prior art enclosure or chassis design and card guide mounting system is its limited ability to expand or adapt to accept additional replacement or modified circuit cards. This limitation is primarily caused by the use of segregated or partitioned areas dedicated to receive a fixed number of cards having a fixed dimension. Once an area was full, additional cards can not be accommodated. The inability to adapt to or accommodate different numbers of circuit cards having different dimensions severely limits the life span of the enclosure or chassis because circuit redesigns often necessitate substantial modification and often complete replacement of the chassis in order to accept new cards of differing numbers and sizes.

Accordingly, there is a need for a chassis and card mounting system capable of accepting for installation cards of varying standard dimensions regardless of location. With such a system, modifications or redesigns of individual or entire systems of circuit cards may be implemented without additionally requiring that the enclosure or chassis be redesigned or replaced.

SUMMARY OF THE INVENTION

The foregoing problems associated with prior art circuit card enclosures are addressed by the chassis and card guide assemblies of the present invention. In accordance with the invention, a plurality of types of card guide assemblies are provided to be mounted within a unique chassis to enable the chassis to be selectively configured to receive circuit cards of varying standard dimensions at any location. The ability of the chassis to be selectively configured obviates the need to redesign or modify the chassis in the event the number and size of the circuit cards mounted within the chassis are changed.

In particular, a pair of first type card guide assemblies of the present invention are mounted within the chassis a predetermined distance apart to facilitate the reception and mounting of circuit cards having a first length and any one of a number of depths. A second type of card guide assembly of the present invention is then selectively positioned and mounted in the chassis, utilizing a unique mounting means, between the first card guide assemblies to function as an adaptable partition for mounting cards in any one of the number of depths and having a second length shorter than the first length. An additional second type card guide assembly may be installed at a different location for mounting cards having a third length shorter than the second length.

In the preferred embodiment, the pair of first type card guide assemblies are secured to the walls of the chassis and positioned a predetermined distance apart for accepting circuit cards having a standard length of 9U. The first type card guide assemblies are further configured to retain circuit cards having either a standard depth of 160 mm or a taller standard depth of 220 mm. The second type of card guide is secured within the chassis between the pair of first type card guide assemblies utilizing the unique mounting means at one or more selected slot locations to form a slot partition for accepting circuit cards of either the 6U or 3U standard length. The second type card guide assemblies are configured to retain cards of either standard depth in conjunction with the first guide assemblies. Thus, the chassis is capable of being selectively configured and reconfigured to accept varying length and depth cards regardless of location through the installation of the second card guide assemblies at selected slot locations.

BRIEF DESCRIPTION OF THE DRAWINGS

A more complete understanding of the adaptable card mounting system of the present invention may be had by reference to the following Detailed Description when taken in conjunction with the accompanying Drawings, wherein:

FIGS. 3A–3D show the card guide assemblies of the present invention for installation in the chassis of FIG. 2;

DETAILED DESCRIPTION OF THE DRAWINGS

Figure 1:
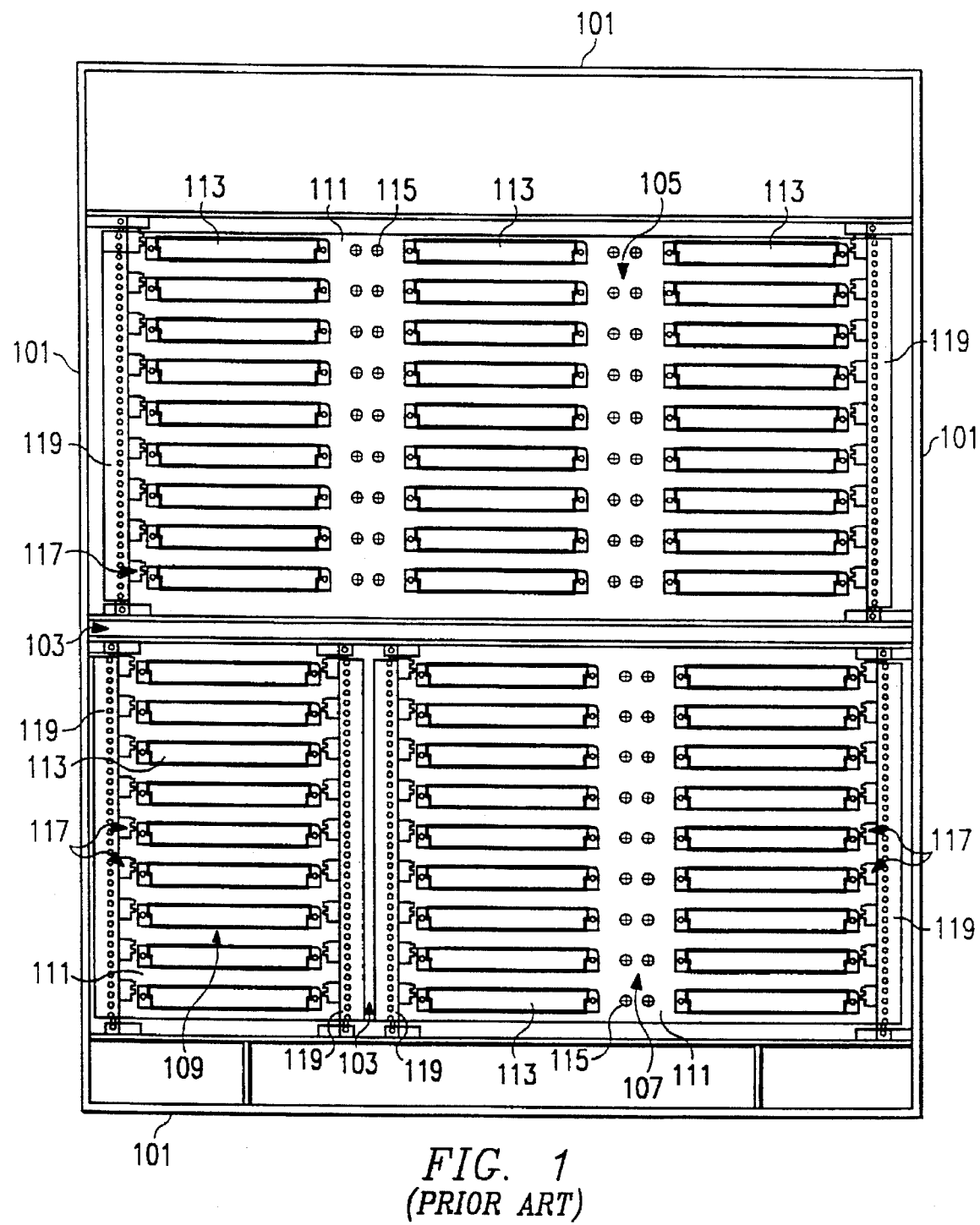
FIG. 1 is a top view of a prior art enclosure or chassis having segregated areas for accommodating cards of varying dimensions.

FIG. 1 shows a typical enclosure or chassis 101 of the prior art wherein certain areas 105, 107 and 109 of the chassis are segregated from other areas of the chassis utilizing a number of fixed partitions 103. Each segregated area 105, 107 and 109 within the chassis 101 is designed to accept for installation a preset number of circuit cards (not shown) each having a predetermined dimension (length by depth). A plurality of interconnected backplanes 111 are included within the chassis 101 to facilitate communications between the segregated areas 105, 107 and 109 and the circuit cards mounted therein. The backplanes 111 are mounted to the chassis 101 by means of a plurality of mounting screws 115. A plurality of backplane connectors 113 are provided on each backplane 111 for electrically mating with connectors at the bottom of each circuit card installed in the area. Each horizontal row of connectors 113 defines a slot location 117 for accepting a single circuit card.

The length and depth dimensions for circuit cards accommodated within each segregated area 105, 107 and 109 are fixed by the use of standard card guide assemblies 118 within the chassis 101 comprising card guides 120 and mounting plate 119 of a well known design. The mounting plate 119 of the card guide assemblies 118 are positioned to retain a top edge of circuit cards having a fixed depth, typically of either 160 mm or 220 mm. The spacing between card guide assemblies 118 dictates the length of card accommodated within the segregated area. The card guide assemblies within the area 105, for example, are spaced apart to accommodate one standard 9U circuit card per slot location 117. The card guide assemblies 118 within the areas 107 and 109, on the other hand, accommodate standard 6U and 3U circuit cards, respectively. Furthermore, the placement of the partitions 103 within the chassis 101 fixes the number of slot locations 117 allocated in each segregated area allocated for a particular dimension of circuit card.

Any modifications or additions to a circuit design implemented on circuit cards installed within the chassis 101 of the prior art will typically require a change in the number and type of the circuit cards used. The prior art chassis 101, however, is not configured to accommodate card number or size changes resulting from the circuit modification. This is caused by the space limitations inherent from the use of partitions 103 and card guide assemblies 118 defining the number of slot locations 117 of a fixed length and a fixed depth in each segregated card area 105, 107 and 109. The new circuit cards presented for the modified circuit design will typically necessitate a major redesign of the size and shape of the segregated areas within the chassis 101, and often will result in complete chassis replacement at a considerable additional expense. The prior art chassis 101 thus has a usable life span limited by any future modifications in the circuit design implemented through changes in the number and type of included circuit cards.

Figure 2:
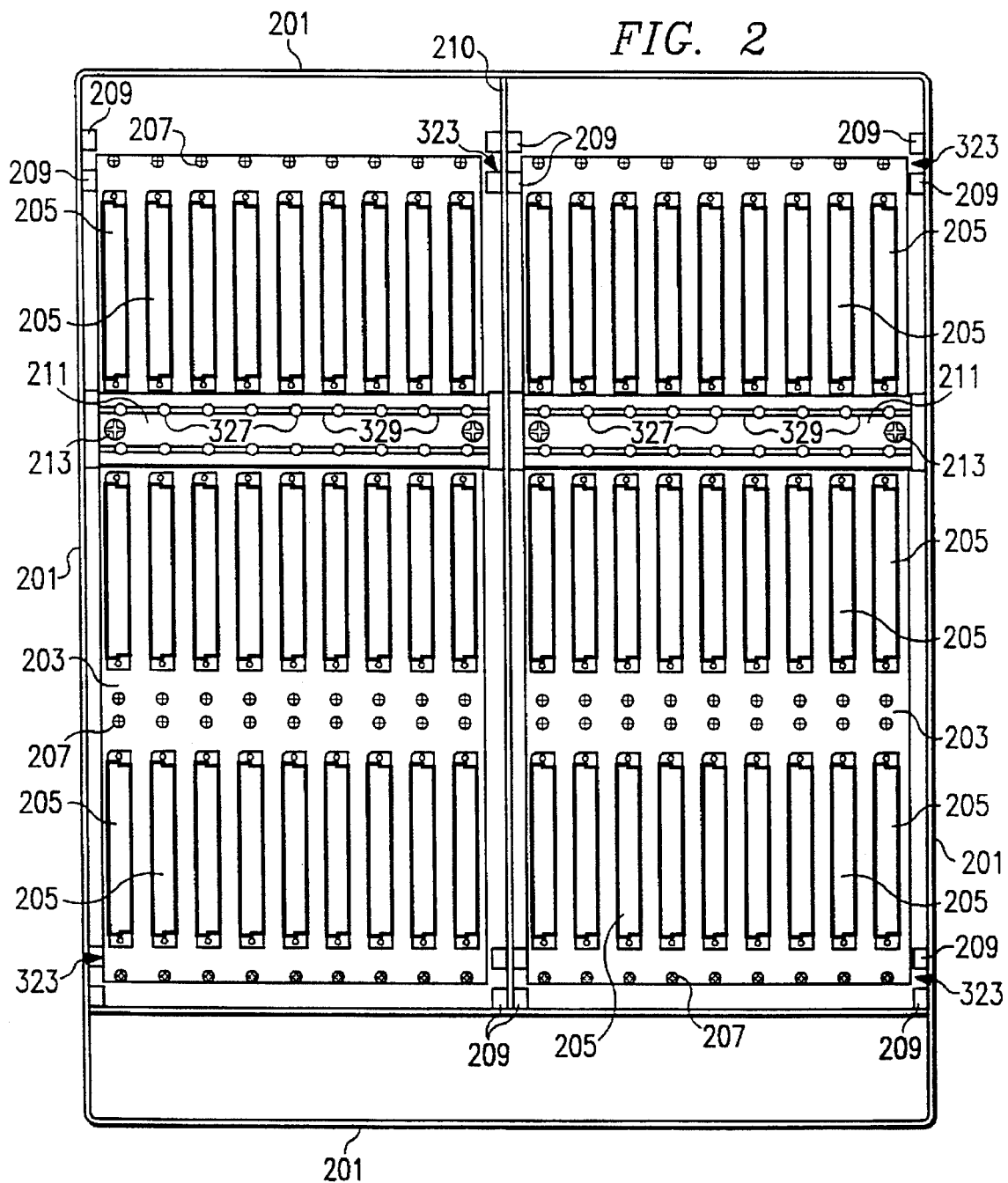
FIG. 2 is a top view of the enclosure or chassis of the present invention.

Referring now to FIG. 2, there is shown a top view of an enclosure or chassis 201 of the present invention. Although the present invention is described herein with respect to its preferred application for installing circuit cards, it will of course be understood that the invention may be used to adjacently install other objects having varying dimensions within an enclosure. The chassis 201 includes means to be described for receiving card guide assemblies of the present invention that enable circuit cards having varying dimensions to be installed therein regardless of slot location 206. A backplane 203 is also included in the chassis 201 having a plurality of backplane connectors 205 for connection to the card connectors (not shown) on the bottom edge of each installed circuit card (not shown) thereby facilitating communications between installed cards. The backplane connectors 205 define a plurality of slot locations 206 within the chassis. A plurality of screws 207 are utilized to secure the backplane 203 to the chassis 201.

The means for receiving card guide assemblies first comprises a pair of lower support bars 211 (hereinafter sometimes referred to as the "3U" lower support bar 211(1) and the "6U" lower support bar 211(2), respectively). One lower bar 211 is secured to the chassis 101 between each pair of horizontal rows of connectors 205 through a set of screws 213. The lower bars 211 extend across the width of the backplane 203 orthogonal to the plurality of slot locations 206. The means for receiving further comprises a pair of mounting brackets 209 and 210 secured to the sides of the chassis 201 and positioned at the opposed ends of the slot locations. The brackets 209 and 210 are offset from each other (as shown) and extend across the width of the chassis 201 orthogonal to the plurality of slot locations 206. Furthermore, as may be more clearly seen in FIG. 6, the brackets 209 and 210 are positioned within the chassis at different heights to facilitate the retention of circuit cards of different depths. The manner with which the pair of lower support bars 211, the pair of mounting brackets 209 and 210 and other included means for receiving not yet described function to mount and secure the card guide assemblies of the present invention (and varying dimension circuit cards) within the chassis 201 will be described in more detail herein.

Figure 3B:
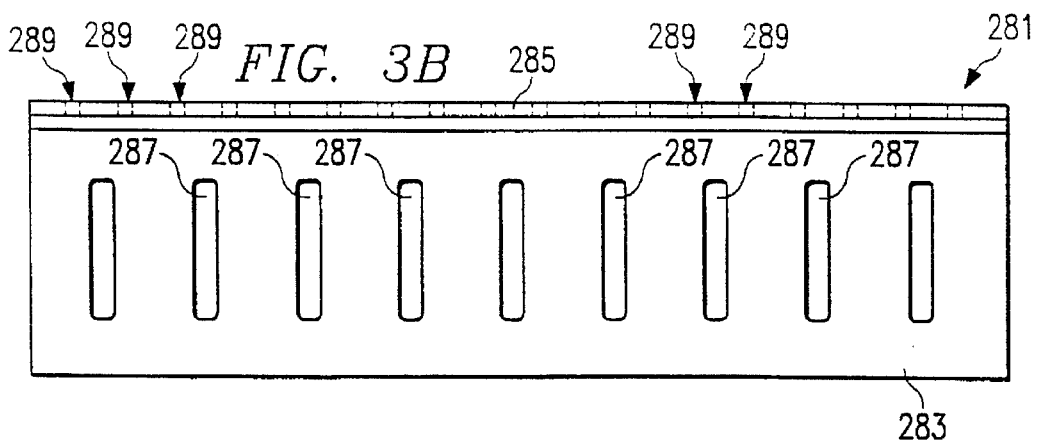

Referring now to FIGS. 3A–3C, there are shown the card guide assemblies of the present invention to be mounted within the chassis 201 of the present invention through use of the means for receiving previously described comprising the pair of lower support bars 211 and the pair of brackets 209 and 210 (see FIG. 2) and further means for receiving not yet described. Installation of these adaptable card guide assemblies within the chassis 201 enables the chassis to accommodate for installation circuit cards of varying dimensions regardless of location.

FIG. 3A shows a first type card guide assembly 251 to be mounted within the chassis 201 utilizing the first mounting bracket 209 of the means for receiving. The first type card guide assembly 251 comprises a mounting plate 253 and a plurality of card guides 255. Each included card guide 255 is fastened to the mounting plate 253 by fasteners 259. Each guide 255 is horizontally positioned to correspond, when the first guide assembly 251 is installed within the chassis 201, with a slot location 206 and thus accept a side edge of an installed circuit card. A plurality of ventilation openings 261 are provided in the mounting plate 253 to facilitate the flow of air through the chassis 201 between circuit cards installed in the card guides 255. Furthermore, a plurality of mounting openings 263 are also provided in the plate 253 to allow passage of fasteners through the plate and into the first bracket 209 to secure the first guide assembly 251 within the chassis 201 (see, FIG. 6). When mounted within the chassis at opposed ends of the plurality of slot locations, the first card guide assemblies 251 will configure the chassis to accept circuit cards of a first length.

FIGS. 3B and 3C show the two embodiments of the second type card guide assembly 303 and 301, respectively, to be mounted within the chassis 201 utilizing either one of the pair of lower support bars 211 in a manner to be described. The second type card guide assemblies 301 and 303, when installed, function as partitions at selected slot locations 206 thus enabling each slot location to be individually and selectively configured to receive a circuit card having a second length different from and shorter than the first length of card installed between the opposed first type card guide assemblies 251.

Each second type card guide assembly 301 and 303 comprises a mounting plate 305, a card guide 307 and a partition retainer 309. Although disclosed as having only one card guide 307, it will of course, be understood that the second guide assemblies 301 and 303 may include two or more guides 307, and thus form a multi-slot partition, if desired. Each card guide 307 is attached to the mounting plate 305 by fasteners 306 and, when installed as a slot partition, the card guide 307 of either second guide assembly 301 or 303 will accept a side edge of an installed circuit card. The partition retainer 309 is attached to, or is made an integral part of, the mounting plate 305. A plurality of mounting holes 311 are included in the retainer 309 to accept a mounting screw, pin or other mounting means in a manner to be described to assist in the retention of the card within the chassis 201 by securing the top edge of a circuit card to the second card guide assembly 301 or 303. The partition retainer 309 thus prevents shifting of the card along the card guide 307 and also prevents disengagement of the mated connectors.

The two embodiments of the second type card guide assemblies 301 and 303 differ in the vertical positioning of the partition retainers 309 when installed within the chassis 201. The second embodiment of the second type card guide assembly 303 in FIG. 3B has a partition retainer having a vertical position chosen to roughly correspond with the vertical position of the top edge of an installed circuit card having a first depth. The first embodiment of the second type card guide assembly 301 in FIG. 3C has a partition retainer having a vertical position chosen to roughly correspond with the vertical position of the top edge of an installed circuit card having a second depth taller than the first depth.

Figure 4:
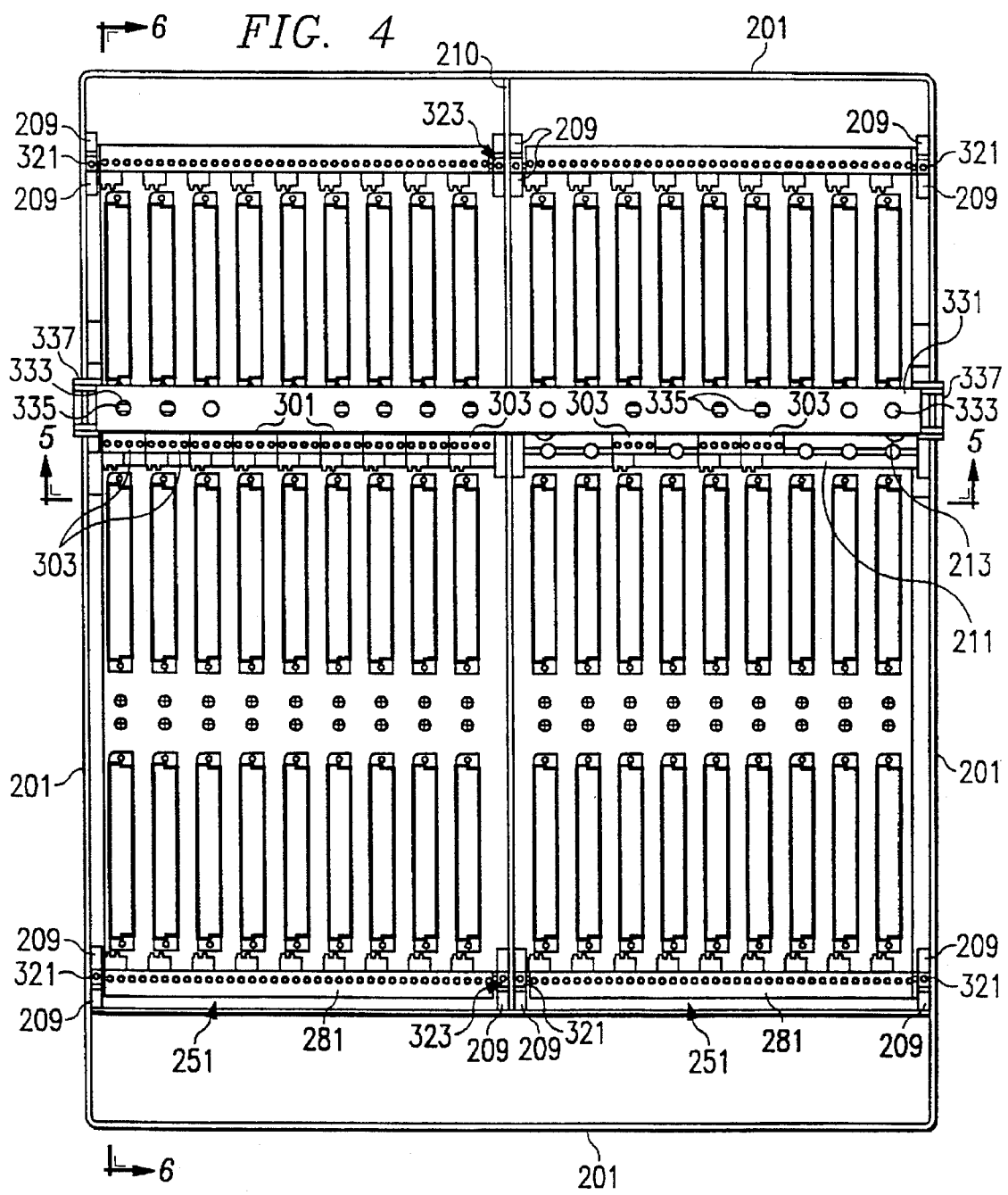
FIG. 4 is a top view of the chassis incorporating the card guide assemblies of the present invention to facilitate the installation of cards having varying dimensions.
Figure 5:
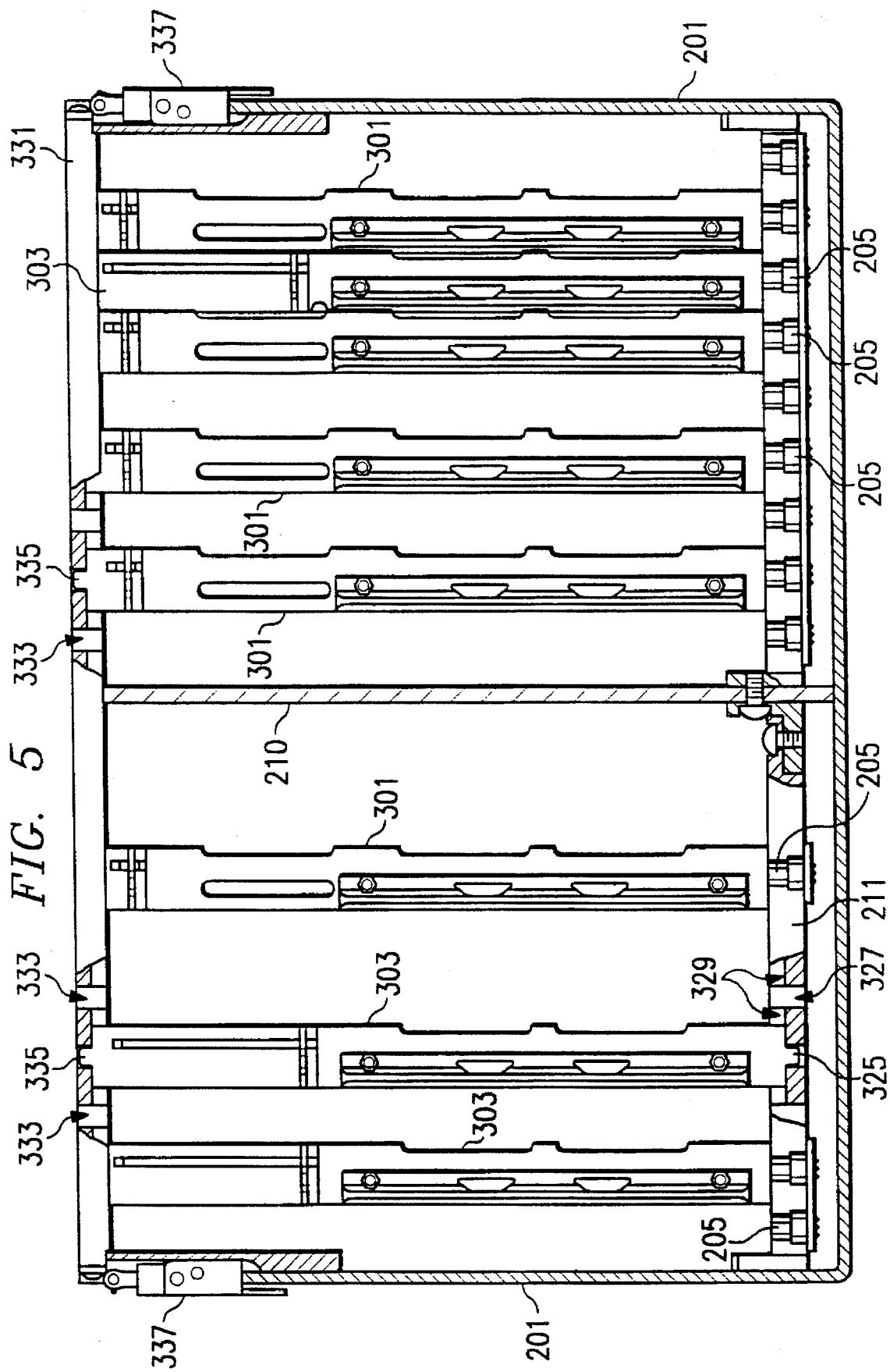
FIG. 5 is a front cross-sectional view of the chassis shown in FIG. 4 taken along line 5—5.
Figure 6:
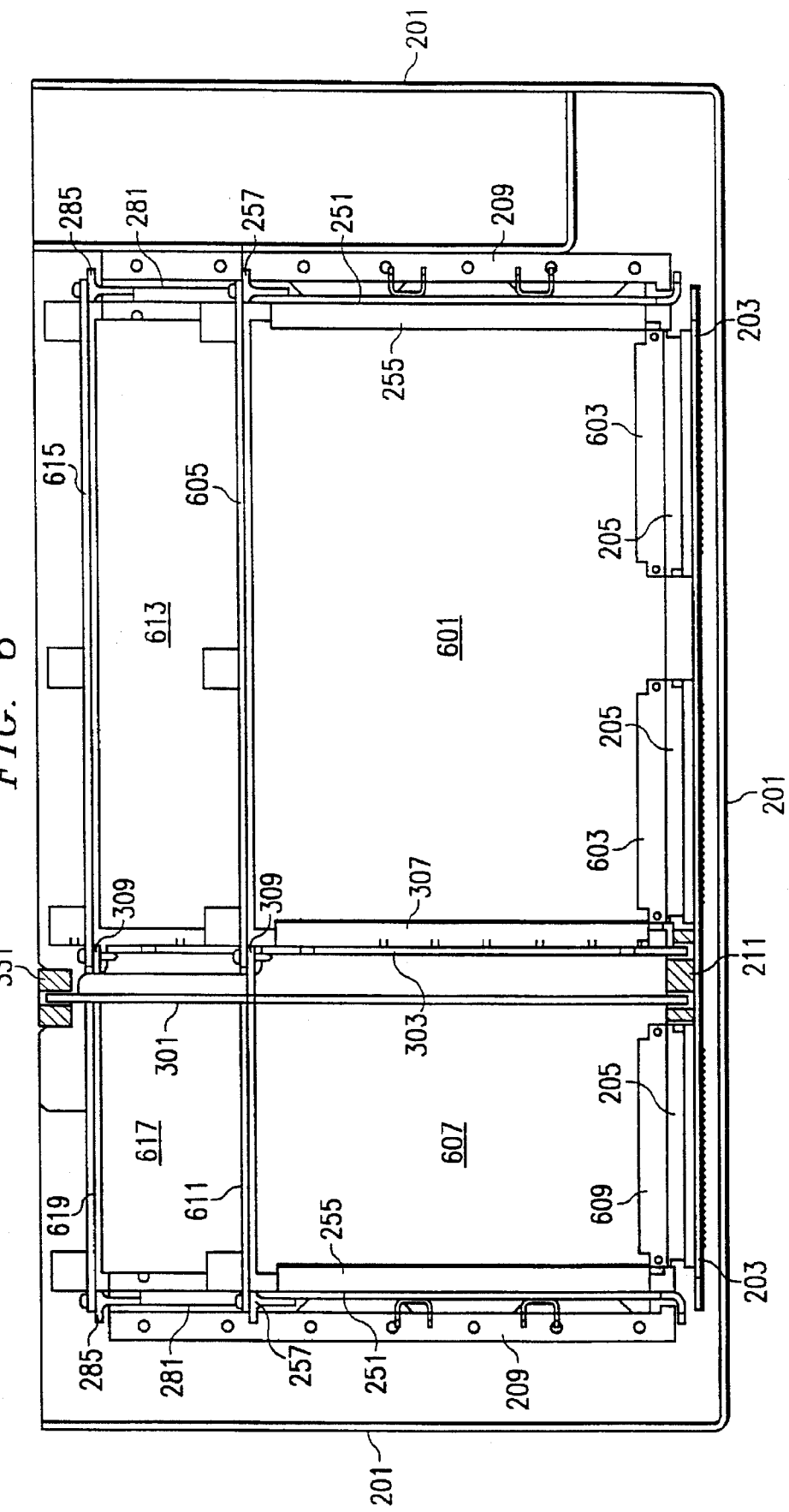
FIG. 6 is a side cross-sectional view of the enclosure shown in FIG. 4 taken along line 6—6.

As will be shown and described in more detail with respect to FIGS. 5 and 6, the first and second brackets 209 and 210 further include means for receiving end retainers 281 (see FIG. 3D) that are positioned to have a vertical position that substantially corresponds with the vertical position of the partition retainers 309 of the guide assemblies 301 and 303, respectively, to facilitate the retaining of the installed circuit card of the first and second depths by securing the top edge of the card. The end retainers 281 will be described in more detail herein with respect to FIGS. 4 and 6.

Referring now to FIG. 4, there is shown the chassis 201 of FIG. 2 with the card guide assemblies of the present invention (shown in FIGS. 3A–3C) installed therein. A first type card guide assembly 251 is mounted to the first brackets 209 (not shown, see FIGS. 3 and 6) at each end of the vertical rows of slot locations 206. The means for receiving further includes an end retainer 281 extending across a plurality of slot locations 206 and mounted to the first bracket 209 at a vertical position substantially corresponding to the vertical position of the partition retainer 309 of the second card guide assembly 303 to retain cards having the first depth. The means for receiving further includes a plurality of single slot end retainers 281 mounted to the second bracket 210 at selected slot locations 206 and at a vertical position substantially corresponding to the vertical position of the partition retainer 309 of the second card guide assembly 301 to retain cards having the second depth. The end retainer 282 mounted to the first bracket 209 for retaining first depth cards is partially obscured from view in FIG. 4 by each end retainer 281 mounted to the second bracket 210 at a selected slot location 206 where a card of the second depth is to be retained.

The second type card guide assemblies 301 and 303 and end retainers 281 are mounted at selected slot locations 206 within the chassis using either or both of the lower support bars 211(1) and 211(2) and the second bracket 210, respectively, according to the chassis configuration desired. Each of the second type card guide assemblies 301 and 303 includes a tab 325 and a flange 326 (see FIGS. 3B and 3C) at the bottom edge of the mounting plate 305 that are inserted into one of the sets of openings 327 and slots 329, respectively, in the lower support bar 211 at the selected slot location 206. Using both the openings 327 and the slots 329 in the lower bar 211 to retain the tab 325 and flange 326, respectively, prevents the mounted card guide assemblies 301 or 303 from rotating or shifting following installation within the chassis 201. It will, of course, be understood that other mounting means may be used to secure the second card guide assemblies 301 and 303 to the lower support bars 211.

The means for receiving card guide assemblies further comprises a pair of removable upper support bars 331 (hereinafter sometimes referred to as the "3U" upper support bar 331(1) and the "6U" upper support bar 331(2)) placed above the lower support bars 211(1) and 211(2), respectively, to secure the top of any second card guide assemblies 301 and 303 installed within the chassis 201. Each upper bar 331 includes an opening 333 at each slot location 206 to accept a tab 335 (see FIGS. 3B and 3C) at the top edge of the mounting plate 305 of an installed guide assembly 301 and 303. It will, of course, be understood that other mounting means may be used to secure the second card guide assemblies 301 and 303 to the upper support bars 331. A latch 337 is included on either side of each upper bar 331 to secure the removable upper bar to the side walls of the chassis 201 and retain the installed guide assemblies 301 and 303 therein.

The use of the card guide assemblies 251, 301 and 303 of FIGS. 3A–3C and the end retainers 281 of FIG. 3D at specific slot locations 206 within the chassis 201 enables cards of various lengths and depths to be selectively installed at any slot location. With specific reference to the guides installed on the left side of the chassis 201 in FIG. 4, the lower left portion of the chassis has been selectively configured in all nine slot locations 206 by guide assembly installation to accept either 6U 160 mm (first) depth cards or 6U 220 mm (second) depth cards depending on the location of the card guide assemblies 301 and 303 mounted using what has previously been described as the 6U support bars 211(2) and 331(2) and the corresponding end retainers 281 and 282 mounted to the first and second brackets 209 and 210. Because all available slot locations 206 in the left side of the chassis have been configured for 6U cards by the card guide assemblies 301 and 303 installed in the chassis and retained by the 6U support bars 211(2) and 331(2), the upper left hand portion of the chassis 201 is vacant.

With specific reference now to the right side of the chassis 201 as shown in FIG. 4, the lower right portion is configured to accept either 3U 160 mm depth cards or 3U 220 mm depth cards at the three slot locations 206 where the three guide assemblies 301 and 303 are installed by what has previously been referred to as the 3U support bars 211(1) and 331(1). Note that each assembly 301 has a corresponding end retainer 281 mounted to the second bracket 210 at the slot location 206. The middle right portion is configured to accept either 6U 160 mm depth cards at the three slot locations 206 where the card guide assemblies 303 are installed by the 6U support bars 211(2) and 331(2), or accept 9U 160 mm depth cards or 9U 220 mm depth cards in the remaining slot locations 206 where no card guide assemblies 301 or 303 have been installed. Note that any slot location 206 where an end retainer 281 is mounted to the second bracket 210 are configured to accept 220 mm depth cards. The foregoing selective installation of the second card guide assemblies 301 and 303 in various slot locations 206 illustrates the versatility of the chassis 201, the card guide assemblies 251, 301 and 303 and the end retainers 281 and 282 of the present invention for receiving card guides and installing circuit cards of varying dimension regardless of slot location. Reconfiguration of the chassis 201 to accept new or modified circuit cards merely requires adding or removing second card guide assemblies 301 and 301 at the support bars 211 and 331 and end retainers 281 at the selected slot locations 206.

Referring now to FIG. 5 there is shown a cross-sectional view of the chassis 201 of FIG. 4 at the 6U support bars 211(2) and 331(2). This figure further illustrates the versatility of the present invention through selective use and installation of the second card guide assemblies 301 and 303 and end retainers 281 in the chassis 201. To the left hand side of FIG. 5, there is illustrated the installation of two card guide assemblies 303 and one card guide assembly 301. To the right hand side of the chassis 201 there is illustrated the installation of four card guides assemblies 301 and one card guide assembly 303. Where the second card guide assemblies 303 are shown, the chassis 201 will accommodate 6U 160 mm depth cards. Where the second card guide assemblies 301 are shown, the chassis 201 will accommodate 6U 220 mm depth cards. Where no second type card guide assemblies 301 or 303 are shown, the chassis 201 will accommodate 9U cards of either a 160 mm or 220 mm depth to be secured to the opposed first card guide assemblies 251 mounted to the brackets 209 at the ends of the plurality of slot locations 206. It should, however, be noted that the slot locations 206 where no second type card guide assemblies 301 or 303 are shown may also be configured by means of guide assemblies 301 and 303 installed at the 3U support bars 211(1) and 331(1) and end retainers 281 mounted to the second bracket 210 to support 3U cards of either a 160 mm or 220 mm depth (see, e.g., the lower right portion of FIG. 4, and also the right hand side of FIG. 6).

Although FIG. 5 is disclosed as a cross-section taken along line 5—5 of FIG. 4, it will be noted that the arrangement of the card guide assemblies 301 and 303 in FIG. 5 does not correspond to that shown in FIG. 4. This difference in the location of the card guide assemblies is intentional and is provided to illustrate the card installation versatility of the chassis 201 and card guide assemblies 251, 301 and 303 and end retainers 281 of the present invention. Again, to change the installation configuration of the chassis 201, it is only necessary to add or remove card guide assemblies 301 or 303 using the 6U and 3U support bars 211 and 331 at selected slot locations 206 and add or remove end retainers 281 mounted to the second brackets 210.

The cross-section in FIG. 5 further illustrates a cut-away view of the upper support bar 331 showing the tab 335 inserted into the opening 333. The lower support bar 211 is also illustrated with a cut-away view showing tab 325 inserted into opening 327. The use of the tabs 325 and 335 in the openings 327 and 333 (along with the flange 326 in the slot 329) secures the assemblies 301 and 303 within the chassis 201. Also shown in greater detail is the latch 337 for securing the removable upper support bar 331 to the side walls of the chassis 201.

Referring now to FIG. 6, there is shown a cross-sectional view taken along the line 6—6 of FIG. 4 illustrating the installation of cards of varying dimensions using the chassis 201, card guide assemblies 251, 301 and 303 and end retainers 281 of the present invention. Card 601 is closest to the observer and shows the installation of a 3U 160 mm depth card extending between a first type card guide assembly 251 on the right (mounted to the first bracket 209) and a second type card guide assembly 303 on the left mounted within the chassis 201 using the 3U support bars 211(1) and 331(1). The side edges of card 601 are supported in the chassis 201 by the card guide 255 on the right and the card guide 307 on the left. The connector 603 for the card 601 is mated with the connector 205 on the backplane 203. A mounting plate 605 on the top edge of the card 601 is secured to the end retainer 282 (mounted to first bracket 209) on the right and to the partition retainer 309 (of assembly 303) on the left to retain the installed card 601 within the chassis 201.

Mounted behind the card 601 and next removed from the viewer is a card 607 that is a 6U 160 mm depth card that extends between the first type card guide assembly 251 on the right and a third type card guide assembly 303 on the left mounted using the 6U support bars 211(2) and 331(2). The side edges of card 607 are supported in the chassis 201 by the card guide 255 (not shown) on the right and the card guide 307 on the left. The two connectors 603 for the card 607 are mated with the connectors 205 on the backplane 203. A mounting plate 609 on the top edge of the card 607 is secured to the end retainer 282 on the right and the partition retainer 309 on the left to retain the installed card 607 within the chassis 201.

Mounted behind the card 607 and next removed from the viewer is a card 611 that is a 9U 160 mm depth card that extends from the card guide assembly 251 on the left to the card guide assembly 251 on the right. The card 611 shows one connector 603 mated with one connector 205 on the backplane 203. However, the card 611 may include one or two additional connectors 603 that are hidden from view behind the cards 601 and 607. The side edges of the card 611 are inserted in the card guides 255 at both the left and the right (the latter not shown as it is hidden from view behind the cards 601 and 607) of the chassis 201. A mounting plate 613 fastened on the top edge of the card 611 is secured to the end retainer 282 on the right and the end retainer 282 on the left (mounted to first bracket 209) to retain the installed card 611 within the chassis 201.

Next removed from the viewer and mounted behind cards 601, 607 and 611 is a card 615 which is a 3U 220 mm depth card extending between the first type card guide assembly 251 on the right and a second type card guide assembly 301 on the left mounted within the chassis 201 using the 3U support bars 211(1) and 331(1). The side edges of card 615 are supported in the chassis 201 by the card guide 255 (not shown) on the right and the card guide 307 (not shown) on the left. The connector 603 (not shown) of the card 615 is mated with a connector 205 (not shown) on the backplane 203. A mounting plate 617 on the top edge of the card 615 is secured to the end retainer 281 (mounted at the installed slot location to the second bracket 210) on the right and to the partition retainer 309 on the left to retain the installed card 615 within the chassis 201.

Next removed from the viewer and mounted behind cards 601, 607, 611 and 615 is a card 621 that is a 6U 220 mm depth card that extends between a first type card guide assembly 251 on the right and a second type card guide assembly 301 on the left mounted within the chassis 201 using the 6U support bars 211(2) and 331(2). The side edges of card 621 are supported in the chassis 201 by the card guide 255 (not shown) on the right and the card guide 307 (not shown) on the left. The connectors 603 (not shown) of card 621 are mated with the connectors 205 (not shown) on the backplane 203. A mounting plate 623 on the top edge of the card 621 is secured to the end retainer 281 on the right and the partition retainer 309 on the left to retain the installed card 621 within the chassis 201.

Finally, FIG. 6 further shows a card 625 that is a 9U 220 mm depth card mounted next removed from the viewer behind cards 601, 607, 611, 615 and 621. The card 625 extends from the card guide assembly 251 on the left to the card guide assembly 251 on the right. The side edges of the card 625 are inserted in the card guide 255 (not shown) at both the left and the right of the chassis 201. The connectors 603 (not shown) of card 625 are mated with the connectors 205 (not shown) on the backplane 203. A mounting plate 627 fastened to the top edge of the card 625 is secured to the end retainer 281 on the right and the en retainer 281 on the left (mounted at the selected slot location to the second bracket 210) to retain the installed card 625 within the chassis 201.

Although FIG. 6 is disclosed as a cross-section taken along line 6—6 of FIG. 4, it will be noted that the arrangement of the cards 601, 607, 611, 615, 621 and 625 does not correspond to the card arrangement shown in FIG. 4. This difference in number, location and type of cards to be installed within the chassis 201 is intentional and is provided to illustrate the card installation versatility of the chassis 201, card guide assemblies 251, 301 and 303 and end retainers 281 of the present invention. Again, to change the configuration of cards within the chassis 201, it is only necessary to add or remove card guide assemblies 301 or 303 using the 3U and 6U support bars 211(1), 211(2), 331(1) and 331(2) and add, at selected slot locations where 220 mm depth cards are to be installed, an end retainer 281 to the second bracket 210. New or additional cards may then be inserted at any free slot location 206.

Although a preferred embodiment of the invention has been illustrated in the accompanying drawings and described in the foregoing detailed description, it will be understood that the invention is not limited to the embodiment disclosed but is capable of numerous rearrangements and modifications of parts and elements without departing from the scope of the invention as set forth in the following claims.

I claim:

1. Apparatus for supporting in adjacent slot locations circuit cards of varying dimensions within a chassis having a plurality of adjacent circuit card slot locations, comprising:

slot end means mounted within the chassis for supporting within the chassis the side edges of a circuit card to configure the chassis for the installation of a circuit card having a predetermined depth and a first length at any one of the plurality of slot locations, said slot end means further comprising circuit card retaining means for securing a leading edge of the circuit card having the predetermined first depth, said circuit card retaining means including an upper retainer for securing the leading edge of a card at any slot location having a first depth, and a lower retainer for securing the leading edge of a card installed at any slot location having a second depth shorter than the first depth;

slot partition means mounted within the chassis to support the side edge of a circuit card having a predetermined depth and a second length shorter than the first length; and at least one mounting means detachably mounted within the chassis between a first and second end of a selected one of any of the plurality of slot locations for mounting the slot partition means at the selected one of the slot locations and for configuring the chassis for the installation of a circuit card at the selected slot location having a second length shorter than the first length.

2. A chassis for supporting circuit cards at adjacent slot locations, comprising:

a plurality of adjacent slot locations for receiving circuit cards, the slot locations extending within the chassis between slot ends;

slot end card guide assemblies mounted within the chassis at the slot ends for supporting the side edges of a circuit card having a first length installed at any selected slot location;

slot partition mounting means detachably positioned within the chassis between the slot ends including means for supporting at one or more selected slot locations a slot partition card guide assembly, each slot partition card guide assembly securing a side edge of a circuit card having a second length shorter than said first length; and said slot end card guide assemblies and said slot partition card guide assembly including an upper retainer for securing a leading edge of a card installed at any slot location having a first depth, and a lower retainer for securing a leading edge of a card installed at any slot location having a second depth shorter than the first depth.

3. The chassis as in claim 2 wherein the slot partition mounting means comprises:

lower support means extending across a bottom of the chassis orthogonal to the slot locations including means for supporting a bottom edge of each received slot partition card guide assembly; and upper support means positioned to correspond with the position of the lower support means and extend across a top of the chassis.

4. The chassis as in claim 3 wherein the slot partition mounting means further includes latch means for detachably securing the upper support means to the top of the chassis.

5. Apparatus for installing circuit cards of varying dimensions within a chassis having a plurality of circuit card slot locations, comprising:

slot end means mounted within the chassis for securing within the chassis the side edges of a circuit card and configuring the chassis for the installation of a circuit card having a predetermined depth and a first length at any one of the plurality of slot locations, wherein the slot end means further includes card retainer means comprising:

an upper retainer for securing a leading edge of a card installed at any slot location having a first depth;

a lower retainer for securing the leading edge of a card installed at any slot location having a second depth shorter than the first depth;

slot partition means for securing the side edge of a circuit card; and at least one mounting means detachably positioned within the chassis between a first and second end of the plurality of slot locations for supporting the slot partition means at a selected one of the slot locations and for configuring the chassis for the installation of a circuit card at the selected slot location having the predetermined depth and having a second length shorter than the first length.

6. The apparatus as in claim 5 wherein slot partition means further includes card retainer means comprising an upper retainer for securing a top edge of a card installed at the selected slot location having the first depth.

7. The apparatus as in claim 5 wherein slot partition means further includes card retainer means comprising a lower retainer for securing the top edge of a card installed at the selected slot location having the second depth.

* * * * *